United States Patent
Chang et al.

(10) Patent No.: US 9,025,375 B2
(45) Date of Patent: May 5, 2015

(54) MEMORY DISTURB REDUCTION FOR NONVOLATILE MEMORY

(71) Applicant: Macronix International Co., Ltd., Hsinchu (TW)

(72) Inventors: Yu-Ming Chang, Jiadong Township (TW); Yung-Chun Li, New Taipei (TW); Hsing-Chen Lu, Hsinchu (TW); Hsiang-Pang Li, Zhubei (TW); Cheng-Yuan Wang, Taipei (TW); Yuan-Hao Chang, Taipei (TW); Tei-Wei Kuo, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/060,296

(22) Filed: Oct. 22, 2013

(65) Prior Publication Data
US 2014/0307505 A1 Oct. 16, 2014

Related U.S. Application Data

(60) Provisional application No. 61/811,821, filed on Apr. 15, 2013.

(51) Int. Cl.
G11C 16/04 (2006.01)
G11C 16/34 (2006.01)
G06F 12/02 (2006.01)

(52) U.S. Cl.
CPC ........ G11C 16/3427 (2013.01); G06F 12/0246 (2013.01)

(58) Field of Classification Search
CPC . G11C 16/3418; G11C 16/0483; G11C 16/10
USPC ............ 365/185.02, 230.03, 185.17, 185.29, 365/185.11
See application file for complete search history.

(56) References Cited

U.S. PATENT DOCUMENTS

| 5,404,485 | A | 4/1995 | Ban |
| 5,905,993 | A | 5/1999 | Shinohara |
| 6,732,221 | B2 | 5/2004 | Ban |
| 8,654,585 | B2 * | 2/2014 | Oh et al. .................. 365/185.17 |
| 2011/0119431 | A1 * | 5/2011 | Chowdhury .................. 711/103 |
| 2011/0305088 | A1 | 12/2011 | Huang et al. |
| 2012/0081962 | A1 | 4/2012 | Tsai et al. |

(Continued)

OTHER PUBLICATIONS

Chang, K-P., et al., "Memory Architecture of 3D Vertical Gate (3DVG) NAND Flash Using Plural Island-Gate SSL Decoding Method and Study of It's Proram Inhibit Characteristics", 2012 4th IEEE International Memory Workshop (IMW), May 20-23, 2012, pp. 1-4.

(Continued)

*Primary Examiner* — Connie Yoha
(74) *Attorney, Agent, or Firm* — Kenta Suzue; Haynes Beffel & Wolfeld LLP

(57) ABSTRACT

Technology is described that supports reduced program disturb of nonvolatile memory. A three/two dimensional NAND array includes a plurality of pages, which are divided into a plurality of page groups. Access is allowed to memory cells within a first page group of a plurality of page groups in an erase block of the three dimensional NAND array, while access is minimized to memory cells within a second page group of the plurality of page groups in the erase block of the three/two dimensional NAND array. Pages in the same page group are physically nonadjacent with each other in the three/two dimensional NAND array.

21 Claims, 11 Drawing Sheets

(56) References Cited

U.S. PATENT DOCUMENTS

2012/0170365 A1* 7/2012 Kang et al. ............... 365/185.03
2014/0071756 A1* 3/2014 Iwai et al. ................ 365/185.11

OTHER PUBLICATIONS

Chang, L-P., et al., "An Adaptive Striping Architecture for Flash Memory Storage Systems of Embedded Systems", Proceedings of the Eighth IEEE Real-Time and Embedded Technology and Applications Symposium (RTAS'02), Sep. 27, 2002, p. 1-10.

Chang, Y-H., et al., "Endurance Enhancement of Flash-Memory Storage Systems: An Efficient Static Wear Leveling Design", DAC 2007, Jun. 4-8, 2007, pp. 212-217.

Chang, Y-M., et al., "A Disturb-Alleviation Scheme for 3D Flash Memory", 2013 IEEE/ACM International Conference on Computer-Aided Design (ICCAD), Nov. 18-21, 2013, pp. 1-9.

Chen, B., et al., "Error Correction for Multi-Level NAND Flash Memory Using Reed-Solomon Codes", IEEE Workshop on Signal Processing Systems, Oct. 8-10, 2008, SiPS 2008, p. 94-99.

Chen, C-P., et al., "A Highly Pitch Scalable 3D Vertical Gate (VG) NAND Flash Decoded by a Novel Self-Aligned Independently Controlled Double Gate (IDG) String Select Transistor (SSL)", 2012 Symposium on VLSI Technology VLSIT), Jun. 12-14, 2012, Digest of Technical Papers, p. 91-92.

Cho, H., et al., "KAST: K-Associative Sector Translation for NAND Flash Memory in Real-Time Systems", Design, Automation & Test in Europe Conference & Exhibition, 2009, Apr. 20-24, 2009, pp. 1-6.

Dong, G. et al., "On the Use of Soft-Decision Error-Correction Codes in NAND Flash Memory", IEEE Transactions on Circuits and Systems -I: Regular Papers, vol. 58., No. 2, Feb. 2011, pp. 429-439.

Grupp, L. M., et al., "Characterizing Flash Memory: Anomalies, Observations, and Applications", MICRO'09, 42nd Annual IEEE/ACM International Sympsoium on Microarchitecture, 2009 (MICRO-42), Dec. 12-16, 2009, pp. 24-33.

Gupta, A., et al., "DFTL: A Flash Translation Layer Employing Demand-based Selective Caching of Page-level Address Mappings", ASPLOS XIV, Proceedings of the 14th International Conference on Architectural Support for Programming Languages and Operating Systems, Mar. 7-11, 2009, pp. 229-240.

Huang, P-C., et al., "Joint Management of RAM and Flash Memory with Access Pattern Considerations", 2012 49th ACM/EDAC/IEEE Design Automation Conference (DAC), Jun. 3-7, 2012, 36.3, pp. 882-887.

Hung, C-H., et al., "A Highly Scalable Vertical Gate (VG) 3D NAND Flash with Robust Program Disturb Immunity Using a Novel PN Diode Decoding Structure", 2011 Symposium on VLSI Technology (VLSIT), Digest of Technical Papers, Jun. 14-16, 2011, 4B-1, pp. 68-69.

Jang, J., et al., "Vertical Cell Array using TCAT (Terabit Cell Array Transistor) Technology for Ultra High Density NAND Flash Memory", 2009 Symposium on VLSI Technology Digest of Technical Papers, Jun. 16-18, 2009, 10A-4, pp. 192-193.

Katsumata, R., et al., "Pipe-shaped BiCS Flash Memory with 16 Stacked Layers and Multi-Level-Cell Operation for Ultra High Density Storage Devices", 2009 Symposium on VLSI Technology Digest of Technical Papers, Jun. 16-18, 2009, p. 136-137.

Kim, Jesung, et al., "A Space-Efficient Flash Translation Layer for Compactflash Systems", IEEE Transactions on Consumer Electronics, 48(2): pp. 366-375, May, 2002.

Kim, Jiyoung, et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, Jun. 16-18, 2009, 10A-1, pp. 186-187.

Kim, W., et al., "Multi-Layered vertical Gate NAND Flash Overcoming Stacking Limit for Terabit Density Storage", 2009 Symposium on VLSI Technology Digest of Technical Papers, Jun. 16-18, 2009, 10A-2, pp. 188-189.

Lee, C-H., et al., "Highly Scalable NAND Flash Memory with Robust Immunity to Program Disturbance Using Symmetric Inversion-Type Source and Drain Structure", 2008 Symposium on VLSI Technology, Digest of Technical Papers, Jun. 17-19, 2008, pp. 118-119.

Lee, S-W, et al., "FAST: An Efficient Flash Translation Layer for Flash Memory", Emerging Directions in Embedded and Ubiquitous Computing: EUC Workshops 2006, (Eds): X. Zhou et al., pp. 879-887.

Lee, S., et al., "LAST: Locality-Aware Sector Translation for NAND Flash Memory-Based Storage Systems", ACM SIGOPS Operating Systems Review, 42(6), p. 36-42, Oct. 2008.

Liu, W., et al., "Low-Power High-Throughput BCH Effor Correction VLSI Design for Multi-Level Cell NAND Flash Memories," IEEE Workshop on Signal Processing Systems Design and Implementation, 2006, SIPS '06; Oct. 2006, p. 303-308.

Lu, Chih-Yuan, et al., "Future challenges of flash memory technologies," Microelectronic Engineering 86(3), Mar. 2009, pp. 283-286.

Lue, H-T., et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, Jun. 15-17, 2010, p. 131-132.

Murugan, M., et al., "Rejuvenator: A Static Wear Leveling Algorithm for NAND Flash Memory with Minimized Overhead", 2011 IEEE 27th Symposium on Mass Storage Systems and Technologies (MSST), May 23-27, 2011, pp. 1-12.

Seo, Joo Yun, et al., "Investigation into the Effect of the Variation of Gate Dimensions on Program Characteristics in 3D NAND Flash Array", 2012 IEEE Silicon Nanoelectronics Workshop (SNW), Jun. 10-11, 2012, pp. 1-2.

Shim, Keon-Soo, et al., "Inherent Issues and Challenges of Program Disturbance of 3D NAND Flash Cell", 2012 4th IEEE International Memory Workshop (IMW), May 20-23, 2012, pp. 1-4.

Shin, Yun Seung, "Non-volatile Memory Technologies for Beyond 2010", 2005 Symposium on VLSI Circuits, Digest on Technical Papers, Jun. 16-18, 2005, 10-2, pp. 156-159.

Tanaka, H., et al., "Bit Cost Scalable Technology with Punch and Plug Process for Ultra High Density Flash Memory", 2007 IEEE Symposium on VLSI Technology, Jun. 12-14, 2007, pp. 14-15.

U.S. Appl. No. 14/018,149, filed Oct. 22, 2013, Chang et al., titled "Half Block Management for Flash Storage Devices".

Wang, Yi, et al., "3D-FlashMap: A Physical-Location-Aware Block Mapping Strategy for 3D NAND Flash Memory", Design, Automation & Test in Europe Conference & Exhibition 2012, Mar. 12-16, 2012, pp. 1-6.

Whang, SungJin et al., "Novel 3-dimensional Dual Control-Gate with Surrounding Floating-Gate (DC-SF) NAND Flash Cell for 1Tb File Storage Application", 2010 IEEE International Electron Devices Meeting (IEDM), Dec. 6-8, 2010, pp. 29.7.1 through 29.7.4.

Wu, Chin-Hsien, et al., "An Adaptive Two-Level Management for the Flash Translation Layer in Embedded Systems", IEEE/ACM International Conference on Computer-Aided Design 2006, ICCAD'06, Nov. 5-9, 2006, pp. 601-606.

* cited by examiner

MEMORY DISTURB REDUCTION FOR NONVOLATILE MEMORY

RELATED APPLICATIONS

This application claims the benefit of U.S. Provisional Patent Application No. 61/811,821 filed on 15 Apr. 2013, which application is incorporated by reference as if fully set forth herein.

BACKGROUND OF THE INVENTION

1. Field of the Invention

The present invention relates to memory devices and systems including memory management.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon body which can be in a strip (S), the tunnel dielectric layer is formed of silicon oxide (O), the charge storage layer is formed of silicon nitride (N), the blocking dielectric layer is formed of silicon oxide (O), and the gate comprises polysilicon (S).

Flash memory devices generally are implemented using NAND or NOR architectures, although others are known, including AND architectures. The NAND architecture is popular for its high density and high speed when applied to data storage applications. The NOR architecture is better suited to other applications, such as code storage, where random byte access is important. In a NAND architecture, the programming processes typically rely on Fowler-Nordheim (FN) tunneling, and require high voltages, such as on the order of 20 volts, and require high voltage transistors to handle them. The addition of high voltage transistors on integrated circuits, in combination with transistors used for logic and other data flow, introduces complexity in the manufacturing processes. This increased complexity in turn increases the costs of the devices.

Three-dimensional arrays of NAND memory feature even larger memory capacities in a relatively small volume. While programming a selected cell NAND array, nearby memory cells are subject to program disturb. Memory cells subject to program disturb include: a memory cell in the same NAND string; a memory cell accessed by the same word line and is in the same stack of semiconductor strips but is in a different layer of the stack; a memory cell accessed by the same word line and is in an adjacent stack of semiconductor strips though in the same layer; and a memory cell accessed by the same word line but is in an adjacent stack of semiconductor strips and in a different layer.

One approach to the reduction of program disturb is hot carrier injection, a memory technology suitable for low voltage programming operations, and which is configurable in a NAND architecture. Hot carrier injection in a NAND architecture has been previously described in U.S. application Ser. No. 12/797,994 filed on 10 Jun. 2010, which was published on 15 Dec. 2011 as US Patent Application Publication No 2011/0305088; and also in U.S. application Ser. No. 12/898,979 filed on 6 Oct. 2010, which was published on 5 Apr. 2012 as US Patent Application Publication No 2012/0081962, all of which are fully incorporated by reference.

Despite hot carrier injection, program disturb remains a problem in high density memory. It would be desirable to further improve on program disturb.

SUMMARY

Technology is described that supports reduced program disturb of nonvolatile memory.

One aspect of the technology is a method of operating a three/two dimensional NAND array including a plurality of pages, which are divided into a plurality of page groups. The method comprises:

allowing access to memory cells within a first page group of a plurality of page groups in an erase block of the three/two dimensional NAND array, while minimizing access to memory cells within a second page group of the plurality of page groups in the erase block of the three dimensional NAND array, wherein pages in the page group are physically nonadjacent with each other in the three/two dimensional NAND array.

In one embodiment, the first page group and the second page group have checkerboard patterns offset with respect to each other. Such that, program operations re not performed on physically adjacent pages.

Examples of allowed and minimized access are program and read operations. In one embodiment, program operations are allowed on memory cells within the first page group in the erase block of the three dimensional NAND array, and program operations are minimized on memory cells within the second page group in the erase block of the array. In another embodiment, read operations are allowed on memory cells within the first page group in the erase block of the three dimensional NAND array, and read operations are minimized on memory cells within the second page group in the erase block of the array.

Various embodiments of the technology reduce the overall number of erase operations performed on erase blocks, by responding to an erase command of a page with a logical erase rather than a physical erase, and later collectively erasing such pages. By reducing overall number of erase operations in this manner, the lifetime of the device is lengthened. In embodiment of the technology, an erase instruction for the first page group, results in the page having an invalid status indicating (i) delayed erase of the page and (ii) unavailability of the page for read and write memory operations until at least the delayed erase of the page. In another embodiment of the technology, when both the first and second page groups have received the erase instruction, the erase block which contains these two page groups are erased, and the invalid status for all of the plurality of page groups is removed. After removal of the invalid status, read and program operations are no longer blocked out of hand for at least this reason.

In some embodiments, pages include series of physically adjacent memory cells in the three/two dimensional NAND array.

The three/two embodiments below vary the physical orientation of a page of memory cells among three/two different spatial axes.

In one embodiment, series of physically adjacent memory cells are arranged such that, a page in the plurality of pages includes memory cells in a same memory cell layer of the array, accessed by a same word line, and accessed by different bit lines, wherein any two pages of the first one of the plurality of page groups are mutually physically nonadjacent, due to at least one of:

(i) at least one intervening word line in between the two pages, (ii) at least one intervening memory cell layer in between the two pages, and (iii) the two pages positioned in different memory cell layers and accessed by different word lines.

In another embodiment, series of physically adjacent memory cells are arranged such that, a page in the plurality of pages includes memory cells in different layers of the array, accessed by a same word line, wherein any two pages of the first one of the plurality of page groups are mutually physically nonadjacent, due to at least one of:

(i) at least one intervening word line in between the two pages, (ii) at least one intervening memory string stack in between the two pages, and (iii) the two pages sharing no memory strings and accessed by different word lines.

In a further embodiment, series of physically adjacent memory cells are arranged such that, a page in the plurality of pages includes memory cells in a same layer of the array, accessed by different word lines.

wherein any two pages of the first one of the plurality of page groups are mutually physically nonadjacent, due to at least one of:

(i) at least one intervening memory cell layer in between the two pages, (ii) at least one intervening memory string stack in between the two pages, and (iii) the two pages positioned in different memory cell layers and positioned in different memory string stacks.

Another aspect of the technology is a computing device a processor, a three/two dimensional NAND array and control circuitry. The memory including a plurality of pages, which are divided into a plurality of page groups. The control circuitry, coupled to at least one of the processor and the array, allows access to memory cells within a first page group of a plurality of page groups in an erase block of the three/two dimensional NAND array, while minimizing access to memory cells within a second page group of the plurality of page groups in the erase block of the three/two dimensional NAND array. Virtual erase blocks in a plurality of virtual erase blocks are mapped to one of the plurality of page groups. Page groups in the plurality of page groups include pages from the plurality of pages that are mutually physically nonadjacent in the three/two dimensional NAND array. Pages in the page group are physically nonadjacent with each other in the three/two dimensional NAND array.

A further aspect of the technology is a computer-readable non-transitory storage medium embodying instructions for a three/two dimensional NAND array including a plurality of pages. The three/two dimensional NAND array is divided into a plurality of page groups. The instructions when executed perform:

allowing access to memory cells within a first page group of a plurality of page groups in an erase block of the three/two dimensional NAND array, while minimizing access to memory cells within a second page group of the plurality of page groups in the erase block of the three/two dimensional NAND array, wherein pages in the page group are physically nonadjacent with each other in the three/two dimensional NAND array. Other aspects and advantages of the present invention can be seen on review of the drawings, the detailed description and the claims, which follow.

DETAILED DESCRIPTION

A detailed description of embodiments is provided with reference to the Figures.

Figure 1:
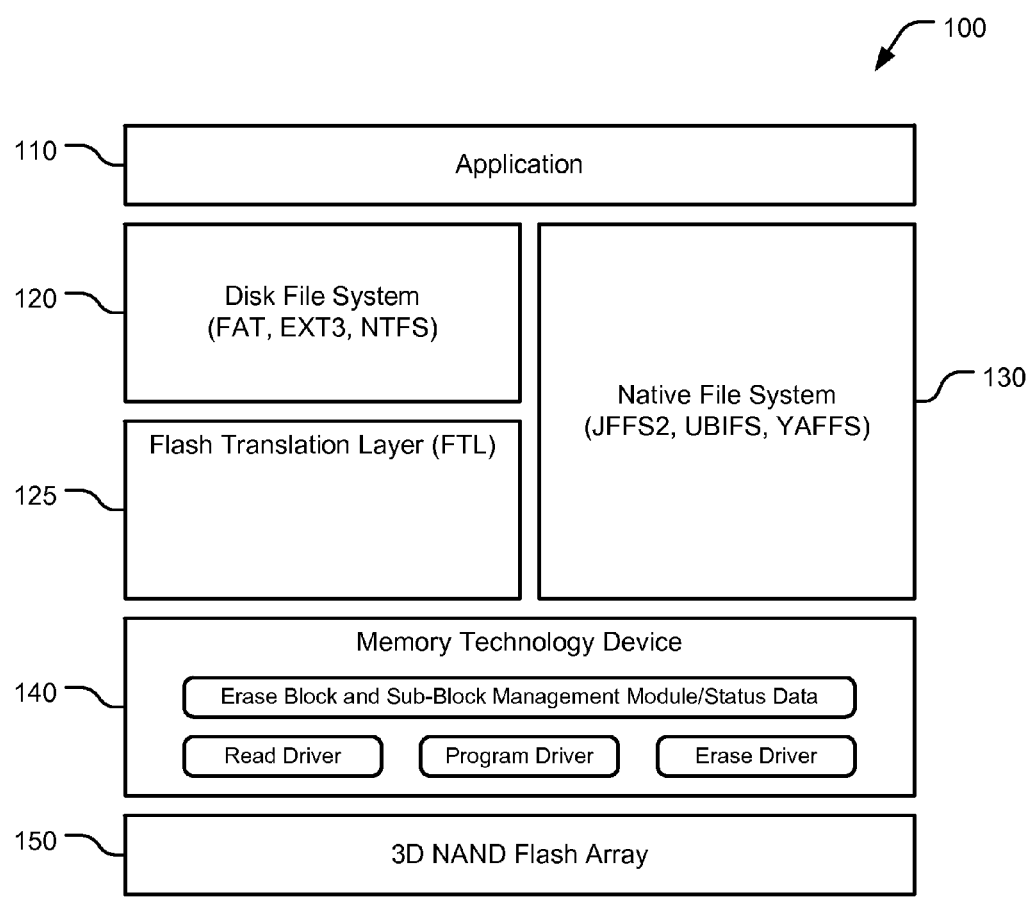
FIG. 1 is a block diagram of an example memory management system.

FIG. 1 is a block diagram of functional layers of a data processing system 100 incorporating a memory, such as a high capacity 3D NAND flash array 150. Alternatively, the memory can be a different variety of NAND flash memory, NOR flash memory, or any suitable memory device with erase blocks. The memory can be physically configured into sectors, such that each physical sector is a minimum size unit for which block erase operations are supported by the memory. An erase block of the memory can correspond to one or more physical sectors. For example, each physical sector of the memory can be 16 KB in size. In some examples, an erase block of the memory 150 can include one physical sector and have the same 16 KB size as the physical sector, or multiple physical sectors, such as 4 physical sectors having an aggregate size of 64 KB, or 8 physical sectors having an aggregate size of 128 KB.

In memory configured for page mode operations, each erase block of the memory can include multiple pages, and each page can be programmed or read by page program and page read operations supported by the memory. For example, a 1-Gbit single-level-cell (SLC) NAND flash memory device can include 1K erase blocks of 128 KB each, and each erase block can include 64 pages of 2 KB each. Each page can include additional storage space (e.g., 64 Bytes) for error correction code (ECC) or other functions. Each erase block can include additional storage space (e.g., 4 KB) for recording bad pages, erase counters, or other data.

A flash memory can be configured so that a page of the memory can be programmed or read by supplying to the memory a page program command or page read command and an address identifying the page. Also, the flash memory can be configured so that each block of the memory can be erased by supplying to the memory a block erase command and an address identifying the block. For example, each particular page of an example 1-Gbit SLC NAND flash memory device can be addressable with a 16-bit address, the 10 most significant bits of the 16-bit address being the address of the block which includes the particular page. In this 1-Gbit SLC NAND example, a page can be programmed or read by supplying to the 1-Gbit SLC NAND flash memory device a page read command or page program command and a 16-bit address identifying the page. In this 1-Gbit SLC NAND example, an erase block can be erased by supplying to the 1-Gbit SLC NAND flash memory device a block erase command and the 10 most significant bits (in the 16-bit address format) identifying the erase block.

The system 100 includes a file system or file systems that store, retrieve, and update data stored in the memory 150 based on requests from an application program 110. The file system in the illustrated example includes a disk file system 120 such as File Allocation Table (FAT) file system, Third Extended File System (EXT3), or New Technology File System (NTFS). The file system in the illustrated example also includes a native file system 130 designed for flash memories such as Journaling Flash File System Version 2 (JFFS2), Unsorted Block Image File System (UBIFS), or Yet Another Flash File System (YAFFS). The file system 120 or 130 accesses the memory 150 through device drivers such as a read driver (for page read operations), a program driver (for page program operations), and an erase driver (for block erase operations). A software layer such as a Memory Technology Device file 140 can provide an interface with the device drivers between the file system 120 or 130 and the memory 150. The Memory Technology Device file 140 includes an erase block and sub-block management module, and associated status data. The erase block and sub-block management module treats the erase blocks as divided into multiple sub-blocks, and manages the invalidation of sub-blocks within erase blocks prior to performing a physical erase of the erase block. Invalidation is a software erase or virtual erase that delays the physical erase until multiple sub-blocks can be physically erased together, as discussed below. The Memory Technology Device file 140 includes an operation handler and free space manager. The operation handler intercepts all of the operations requested from the Flash Translation Layer 125 and recreates operations to the underlying physical blocks by invoking the primitive functions provided by the existing Memory Technology Device file 140. The free space manager manages, allocates, and reallocates free space when there is not enough free space to perform new program operations from the Flash Translation Layer 125.

The system 100 as illustrated also includes Flash Translation Layer 125 serving as an interface between the disk file system 120 and the device drivers (or the Memory Technology Device file 140). The Flash Translation Layer 125 can perform address translation between logical addresses of the disk file system 120 and physical addresses of the memory 150.

In some embodiments the Flash Translation Layer 125 and Memory Technology Device file 140 are placed as firmware on a storage system such as a removable memory card. Such firmware can remove the need to modify higher levels of the file system, making the storage system compatible with legacy systems while enjoying the disclosed improvements. In other embodiments the Memory Technology Device file 140 is integrated into the Flash Translation Layer 125 and/or the native file system 130.

Figure 2:
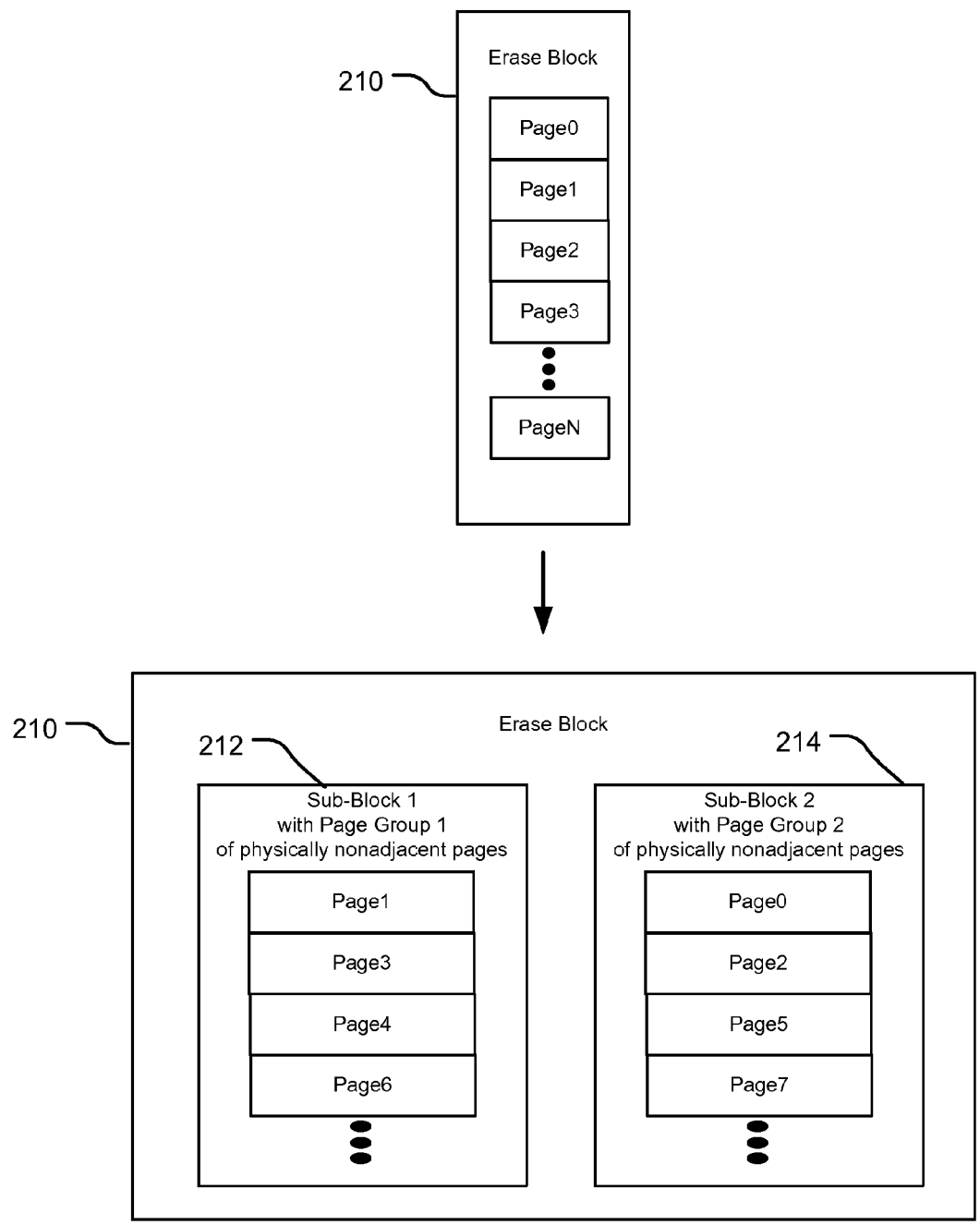
FIG. 2 illustrates an erase block of multiple pages that is mapped into an erase block divided into multiple page groups.

FIG. 2 illustrates an erase block of multiple pages that is mapped into an erase block divided into multiple page groups.

An erase block 210 in the three/two dimensional memory array includes memory pages (page0, page1, page2, page3, . . . , page N). The memory pages of the erase block are logically mapped to multiple sub-blocks of different page groups. Shown are sub-block 1 212 with page group 1 of physically nonadjacent pages, and sub-block 2 214 with page group 2 of physically nonadjacent pages. The pages of page group 1, such as page1, page3, page4, page6, etc., are physically nonadjacent to each other in the three dimensional memory array. The pages of page group 2, such as page0, page2, page5, page7, etc., are physically nonadjacent to each other in the three dimensional memory array. Physically nonadjacent means that, the pages which are arranged in the three dimensional memory array along the x-, y-, and z-axes are not immediately adjacent to each other along any single one of the x-axis or the y-axis or the z-axis. Physically nonadjacent does not exclude an arrangement where the pages which are arranged in the three dimensional memory array along the x-, y-, and z-axes are diagonally proximate, such that the positions of any two pages in the same page group are different by one in two of the x-, y-, and z-axes. Because pages in the same group are physically nonadjacent with respect to each other, a program operation one any page in a page group causes minimal or no program disturb to any other page in the same page group.

Although the Figure shows two sub-blocks, other embodiments can divide an erase block into more than two sub-blocks, each including a page group of pages that are physically nonadjacent to each other in the three dimensional memory array.

Figure 3:
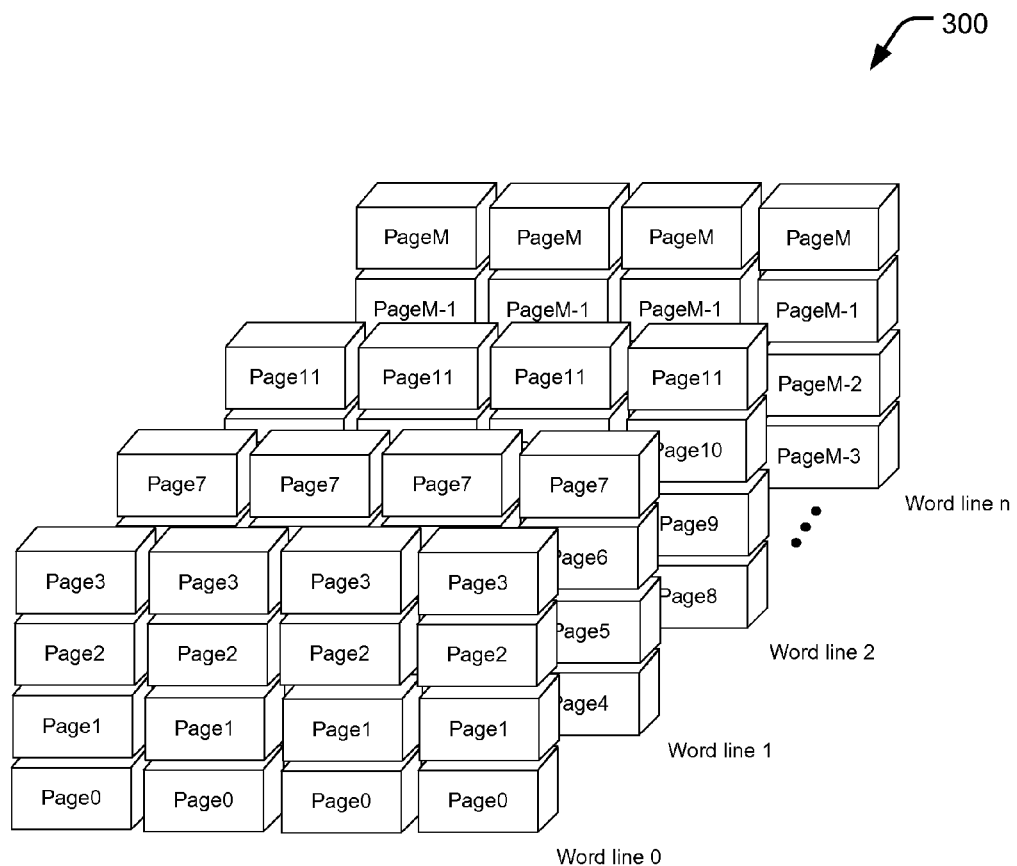
FIG. 3 illustrates an arrangement of a memory page in a three-dimensional memory array that is parallel with a word line.

FIG. 3 illustrates an arrangement of a memory page in a three-dimensional memory array 300 that is parallel with a word line.

In the shown NAND array 300, series of physically adjacent memory cells in a page are arranged such that, a page includes memory cells in a same memory cell layer of the array, accessed by a same word line, and accessed by different bit lines. Different sub-blocks, such as the sub-blocks shown in FIG. 2, are each arranged in a checkerboard pattern in FIG. 3.

For example, memory cells in page0 are in the same memory cell layer, accessed by word line 0, and are accessed by different bit lines (not shown, extending into and out of figure).

Any two pages of a page group are mutually physically nonadjacent, due to at least one of:
(i) at least one intervening word line in between the two pages (such as page1 and page9 separated by word line 1),
(ii) at least one intervening memory cell layer in between the two pages (such as page1 and page3 separated by the memory cell layer including page2), and (iii) the two pages positioned in different memory cell layers and accessed by different word lines (such as page1 and page4, with page1 in the next higher memory cell layer than page4, and page1 and page4 accessed by word line 0 and word line 1 respectively).

Figure 4:
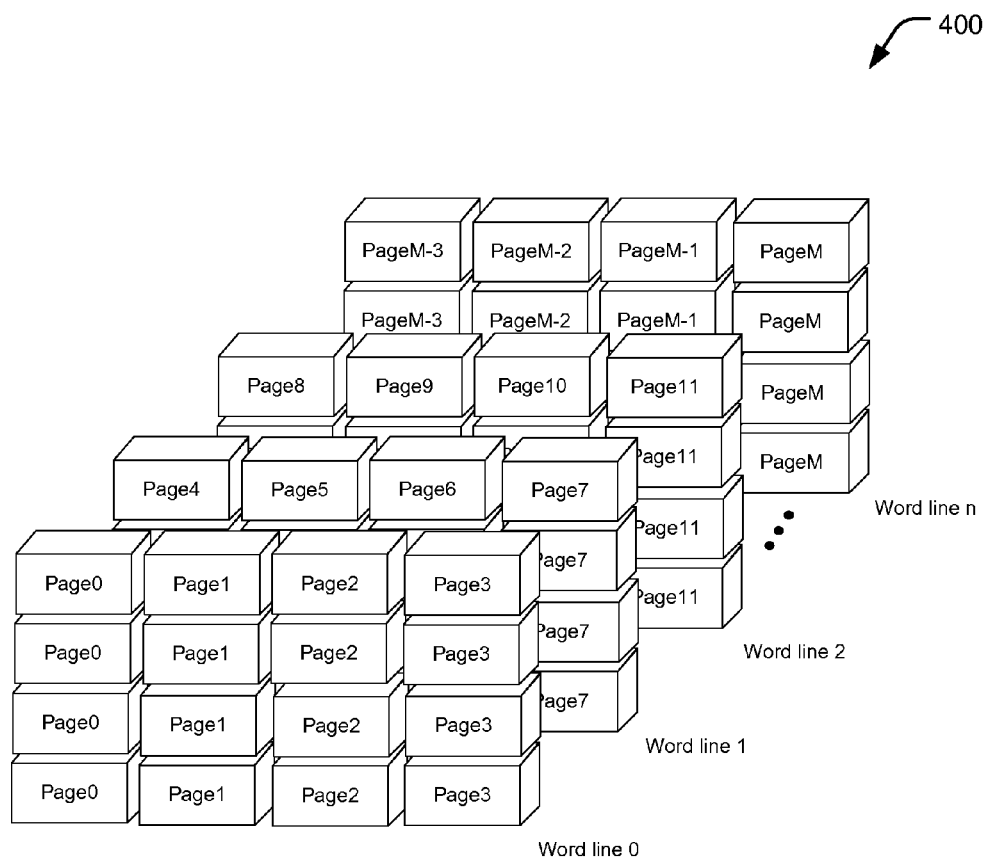
FIG. 4 illustrates an arrangement of a memory page in a three-dimensional memory array that extends through multiple layers of NAND strings.

FIG. 4 illustrates an arrangement of a memory page in a three-dimensional memory array 400 that extends through multiple layers of NAND strings.

In the shown NAND array 400, series of physically adjacent memory cells in a page are arranged such that, a page includes memory cells in different layers of the array, accessed by a same word line. Different sub-blocks, such as the sub-blocks shown in FIG. 2, are each arranged in a checkerboard pattern in FIG. 4.

For example, memory cells in page0 are in different layers of the array, accessed by word line 0.

Any two pages of a page group are mutually physically nonadjacent, due to at least one of:

(i) at least one intervening word line in between the two pages (such as page1 and page9 separated by word line 1), (ii) at least one intervening memory string stack in between the two pages (such as page1 and page3 separated by the memory string stack including page2, page6, page10, page M−1), and (iii) the two pages sharing no memory strings and accessed by different word lines (such as page1 and page4, with page1 and page4 in different, adjacent memory string stacks; and page1 and page4 accessed by word line 0 and word line 1 respectively). Page1 shares the same memory string stack with page5, page9, and pageM−2. Page 4 shares the same memory string stack with page0, page8, and pageM−3.

Figure 5:
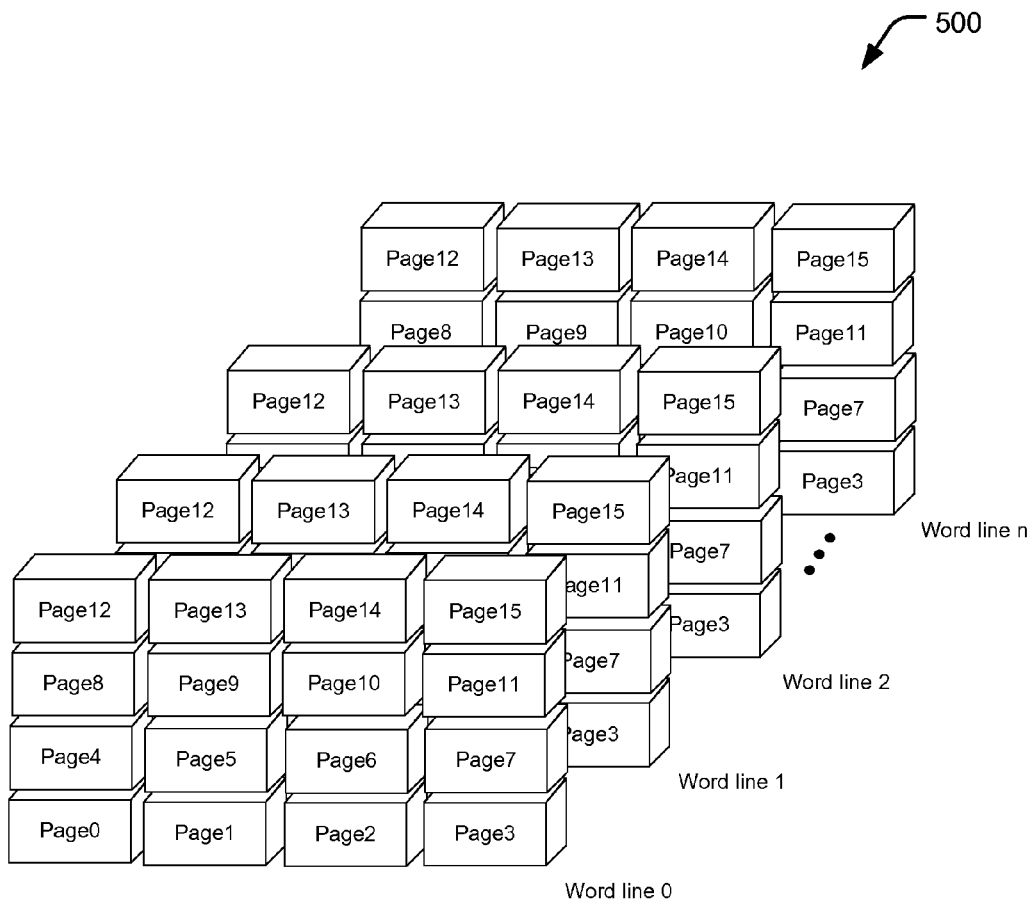
FIG. 5 illustrates an arrangement of a memory page in a three-dimensional memory array that runs along a NAND string.

FIG. 5 illustrates an arrangement of a memory page in a three-dimensional memory array 500 that runs along a NAND string.

In the shown NAND array 500, series of physically adjacent memory cells in a page are arranged such that, a page includes memory cells in a same layer of the array, accessed by different word lines. Different sub-blocks, such as the sub-blocks shown in FIG. 2, are each arranged in a checkerboard pattern in FIG. 5.

For example, memory cells in page0 are in a same layer of the array, accessed by word line 0.

Any two pages of a page group are mutually physically nonadjacent, due to at least one of:

(i) at least one intervening memory cell layer in between the two pages (such as page1 and page9 separated by an intervening memory cell layer including page5), (ii) at least one intervening memory string stack in between the two pages (such as page1 and page3 separated by the memory string stack including page2, page6, page10, and page14), and (iii) the two pages positioned in different memory cell layers and positioned in different memory string stacks (such as page1 and page4, with page1 in the next lower memory cell layer than page4, and page1 and page4 in different adjacent memory string stacks). Page1 shares the same memory string stack with page5, page9, and page13. Page 4 shares the same memory string stack with page 0, page 8, and page12.

Figure 6:
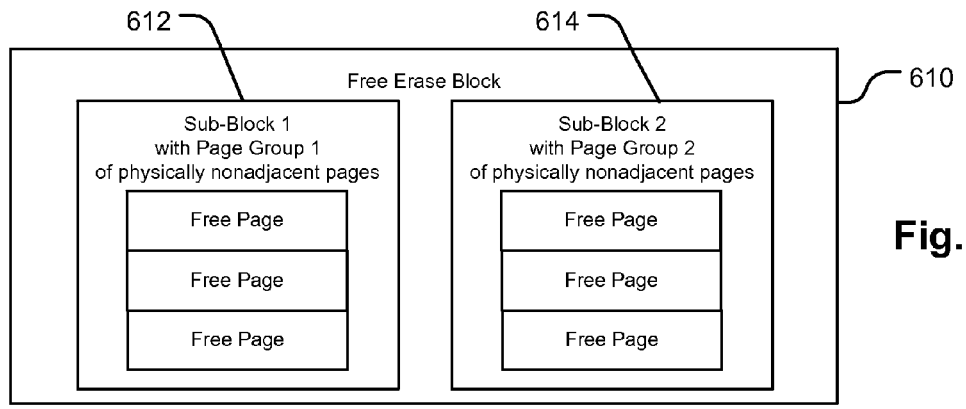
FIG. 6 illustrates a NAND erase block which is free, such that all sub-blocks of the erase block are free.

FIG. 6 illustrates a NAND erase block 610 which is free, such that all sub-blocks of the erase block are free.

NAND erase block 610 includes sub-block 1 612 and sub-block 2 614. Sub-block 1 612 has page group 1 of physically nonadjacent pages. Sub-block 2 614 has page group 2 of physically nonadjacent pages. NAND erase block 610 is free, because sub-block 1 612 has page group 1 of only free pages, and sub-block 2 614 has page group 2 of only free pages.

Figure 7:
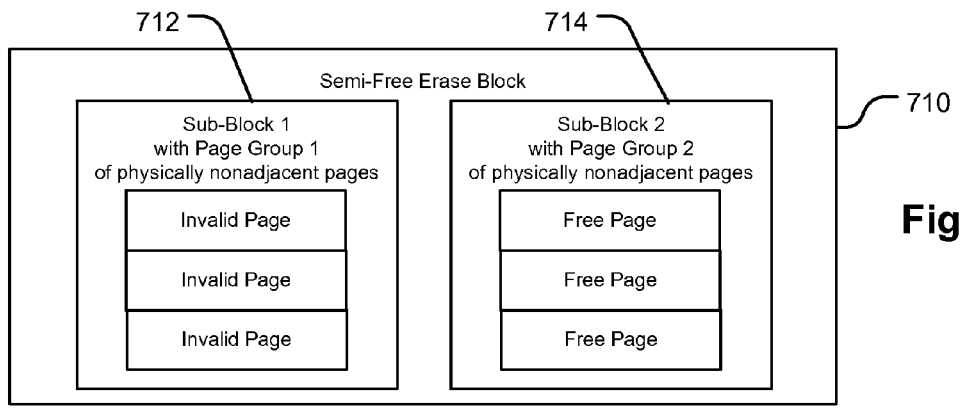
FIGS. 7-8 illustrate a NAND erase block which is semi-free, such that at least one sub-block is invalid, and the remaining sub-blocks free.
Figure 8:
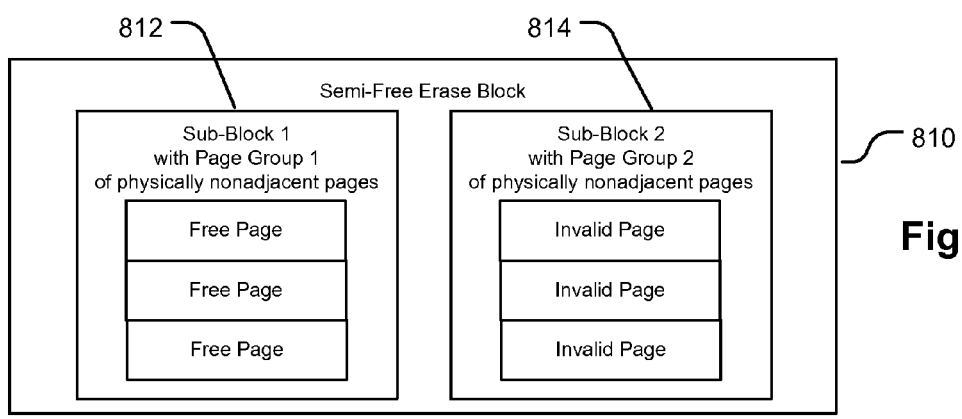

FIGS. 7-8 illustrate a NAND erase block which is semi-free, such that at least one sub-block is invalid, and the remaining sub-blocks are free.

In FIG. 7, NAND erase block 710 includes sub-block 1 712 and sub-block 2 714. Sub-block 1 712 has page group 1 of physically nonadjacent pages. Sub-block 2 714 has page group 2 of physically nonadjacent pages. NAND erase block 710 is semi-free, because at least one sub-block includes only free pages, and at least one sub-block includes only invalid pages. Sub-block 1 712 has page group 1 of only invalid pages, and sub-block 2 714 has page group 2 of only free pages.

In FIG. 8, NAND erase block 810 includes sub-block 1 812 and sub-block 2 814. FIG. 8 is similar to FIG. 7, except that the sub-block with invalid pages and the sub-block with free pages are interchanged.

FIGS. 9-12 illustrate a NAND erase block which is in-use, such that at least one of the sub-blocks is in-use (in these cases sub-block 1), and the other sub-blocks are free and/or invalid (in these cases sub-block 2).

Figure 9:
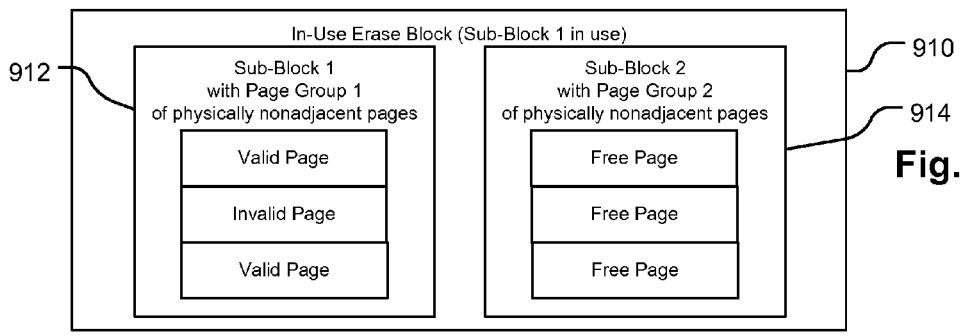
FIGS. 9-12 illustrate a NAND erase block which is in-use, such that at least one of the sub-blocks is in-use, and the other sub-blocks are free and/or invalid.

In FIG. 9, NAND erase block 910 includes sub-block 1 912 and sub-block 2 914. Sub-block 1 912 has page group 1 of physically nonadjacent pages. Sub-block 2 914 has page group 2 of physically nonadjacent pages. NAND erase block 910 is in use, because at least one sub-block includes a valid page. Sub-block 1 912 has page group 1 of valid and invalid pages, and sub-block 2 914 has page group 2 of only free pages.

Figure 10:
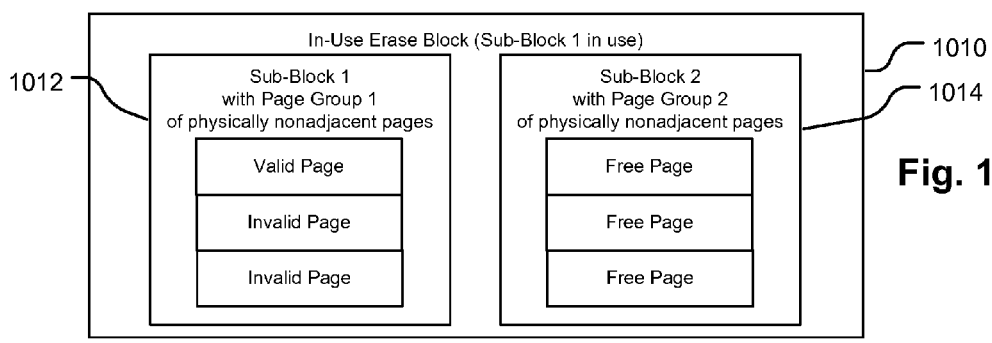

In FIG. 10, NAND erase block 1010 includes sub-block 1 1012 and sub-block 2 1014. FIG. 10 is similar to FIG. 9, except that the respective numbers of valid and invalid pages in sub-block 1 in use are different.

Figure 11:
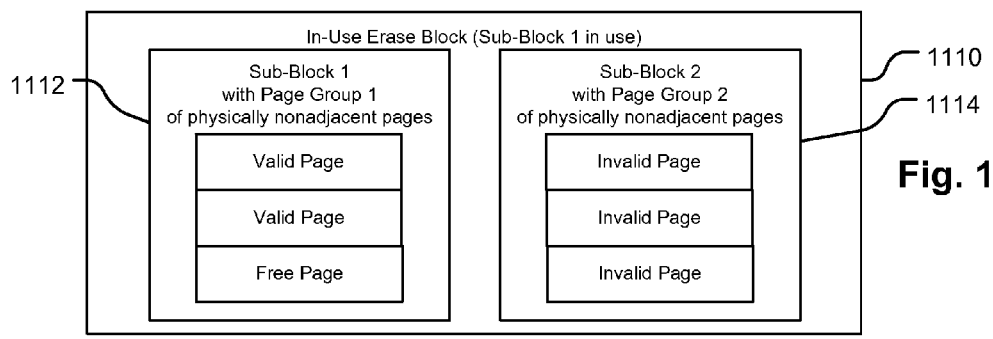
Figure 12:
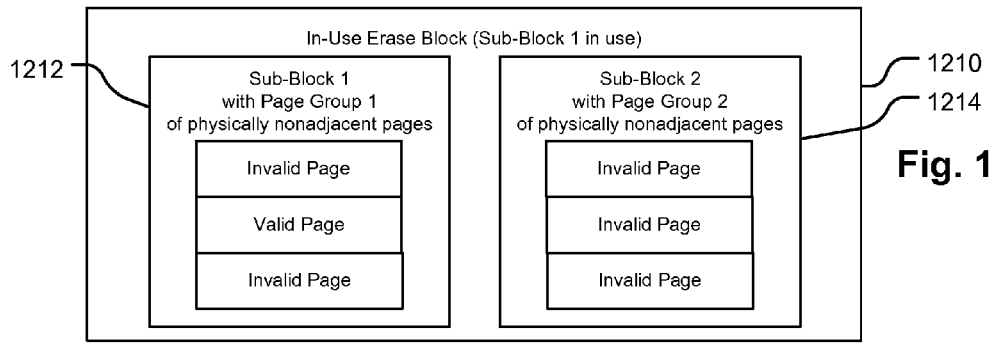

FIGS. 9 and 10 are different from FIGS. 11 and 12 in at least that the sub-block that is not in use (in this case, sub-block 2) is free in FIGS. 9 and 10, and invalid in FIGS. 11 and 12.

In FIG. 11, NAND erase block 1110 includes sub-block 1 1112 and sub-block 2 1114. Sub-block 1 1112 has page group 1 of physically nonadjacent pages. Sub-block 2 1114 has page group 2 of physically nonadjacent pages. NAND erase block 1110 is in use, because at least one sub-block includes a valid page. Sub-block 1 1112 has page group 1 of valid and free pages, and sub-block 2 1114 has page group 2 of only invalid pages.

In FIG. 12, NAND erase block 1210 includes sub-block 1 1212 and sub-block 2 1214. FIG. 12 is similar to FIG. 10, except that the location of valid and invalid pages in sub-block 1 in use are different, and the sub-block that is not in use (in this case, sub-block 2) is free in FIG. 10, and invalid in FIG. 12.

FIGS. 13-16 illustrate a NAND erase block which is in-use, such that at least one of the sub-blocks is in-use (in these cases sub-block 2), and the other sub-blocks are free and/or invalid (in these cases sub-block 1). Unlike FIGS. 9-12, a different sub-block is in-use.

Figure 13:
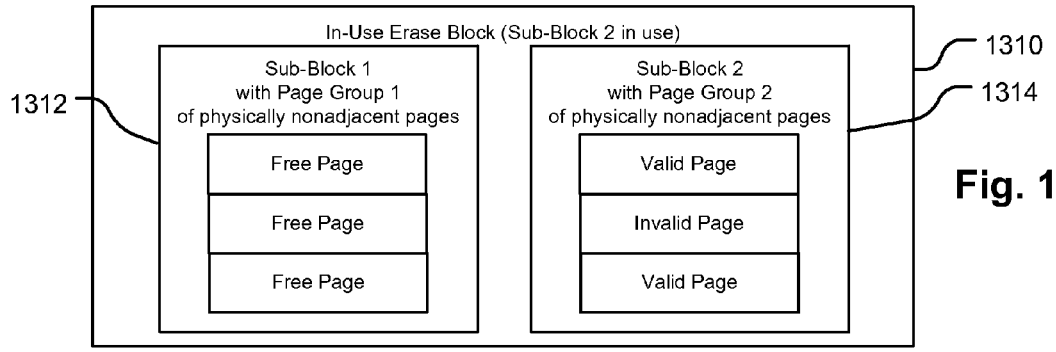
FIGS. 13-16 illustrate a NAND erase block which is in-use, such that at least one of the sub-blocks is in-use, and the other sub-blocks are free and/or invalid; but unlike FIGS. 9-12, a different sub-block is in-use.
Figure 14:
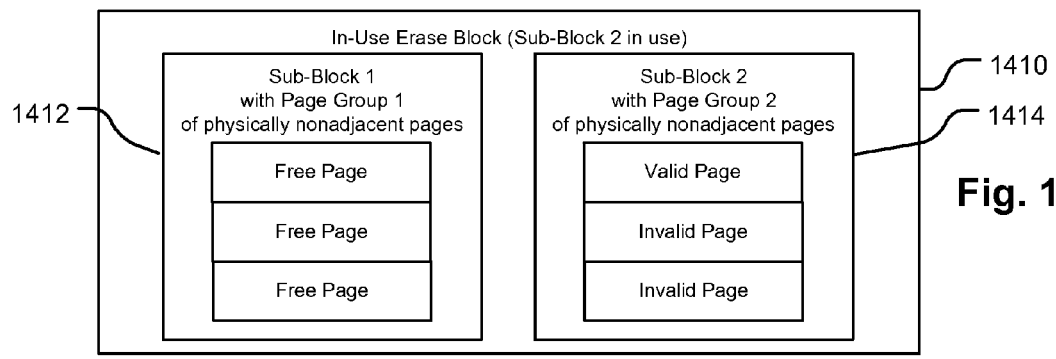
Figure 15:
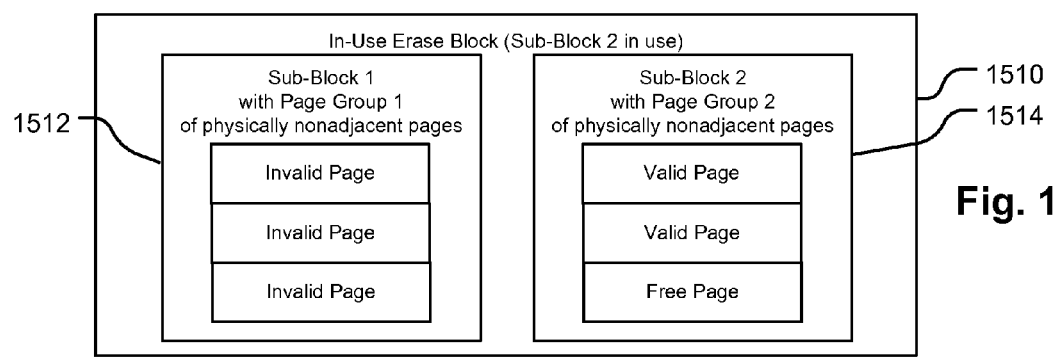
Figure 16:
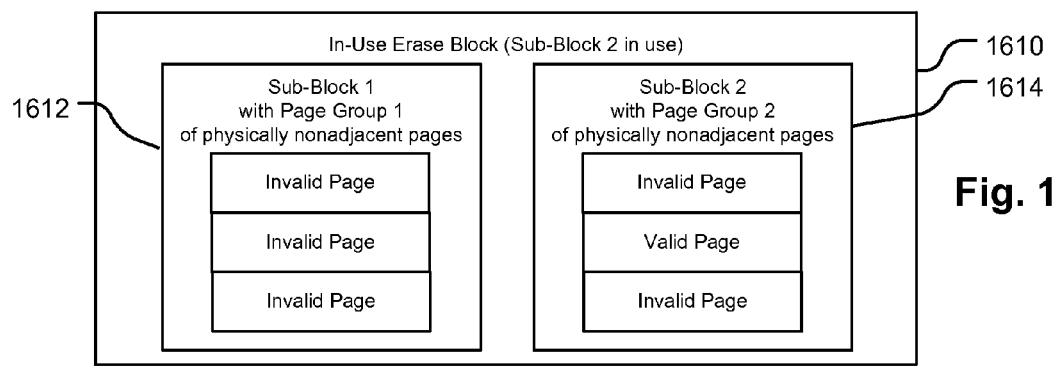

In FIG. 13, NAND erase block 1310 includes sub-block 1 1312 and sub-block 2 1314. In FIG. 14, NAND erase block 1410 includes sub-block 1 1412 and sub-block 2 1414. In FIG. 15, NAND erase block 1510 includes sub-block 1 1512 and sub-block 2 1514. In FIG. 16, NAND erase block 1610 includes sub-block 1 1612 and sub-block 2 1614. FIGS. 13-16 are similar to FIGS. 9-12 respectively, except that the in-use sub-block and the not-in-use sub-block are interchanged.

Figure 17:
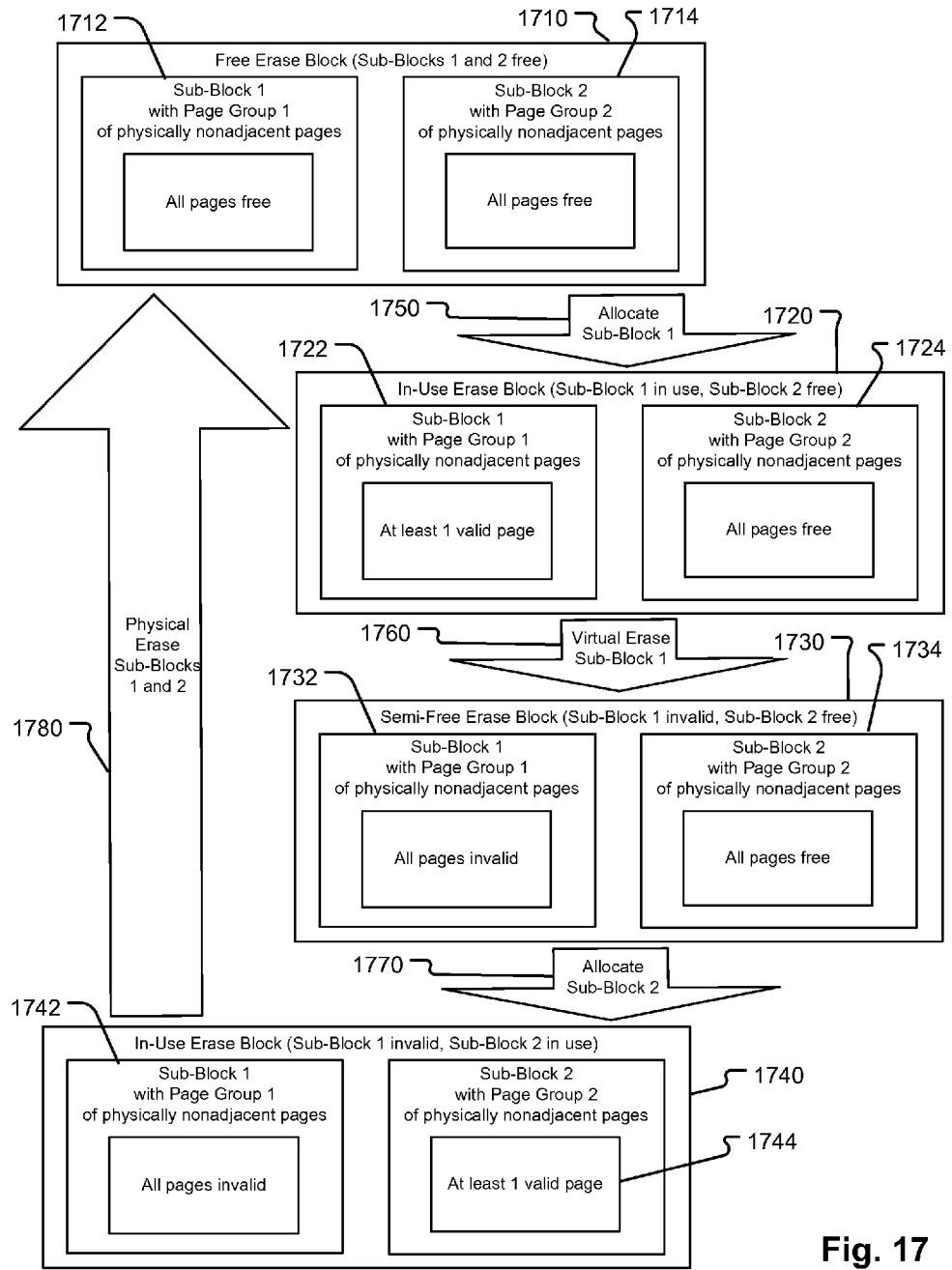
FIG. 17 shows a simplified life cycle of an erase block.

FIG. 17 shows a simplified life cycle of an erase block.

As an overview of FIG. 17, the life cycle proceeds in the following order: free erase block (sub-blocks 1 and 2 free)

1710; in-use erase block (sub-block 1 in use, sub-block 2 free) 1720; semi-free erase block (sub-block 1 invalid, sub-block 2 free) 1730; in-use erase block (sub-block 1 invalid, sub-block 2 in use) 1740; and back to free erase block (sub-blocks 1 and 2 free) 1710.

A more detailed discussion of FIG. 17 follows.

Free NAND erase block 1710 includes sub-block 1 1712 and sub-block 2 1714. Sub-block 1 1712 has page group 1 of physically nonadjacent pages. Sub-block 2 1714 has page group 2 of physically nonadjacent pages. NAND erase block 1710 is free, because all sub-blocks include only free pages. Sub-block 1 1712 has page group 1 of only free pages, and sub-block 2 1714 has page group 2 of only free pages.

In 1750, sub-block 1 is allocated. Free NAND erase block 1710 becomes in-use NAND erase block 1720.

In-use NAND erase block 1720 includes sub-block 1 1722 and sub-block 2 1724. NAND erase block 1720 is in use, because at least one sub-block includes a valid page. Sub-block 1 1722 has been allocated and includes at least 1 valid page. Sub-block 2 1724 still has page group 2 of only free pages.

In 1760, sub-block 1 is virtually erased. In-use erase block 1720 becomes semi-free erase block 1730. As a consequence of the virtual erase, sub-block 1 has an invalid status indicating (i) delayed erase of the pages in sub-block 1 and (ii) unavailability of the pages in sub-block 1 for read and write memory operations until at least the delayed erase of the pages in sub-block 1.

Semi-free NAND erase block 1730 includes sub-block 1 1732 and sub-block 2 1734. NAND erase block 1730 is semi-free, because at least one sub-block is invalid, and the remaining sub-blocks free. Sub-block 1 1732 has page group 1 of only invalid pages, and sub-block 2 1734 has page group 2 of only free pages.

In 1770, sub-block 2 is allocated. Semi-free NAND erase block 1730 becomes in-use NAND erase block 1740.

In use NAND erase block 1740 includes sub-block 1 1742 and sub-block 2 1744. NAND erase block 1740 is in use, because at least one sub-block includes a valid page. Sub-block 1 1742 is invalid. Sub-block 2 1744 has been allocated and includes at least 1 valid page.

In 1780, sub-blocks 1 and 2 are physically erased, including the delayed erase of sub-block 1 which had been invalid. In-use NAND erase block 1740 returns to free NAND erase block 1710.

Figure 18:
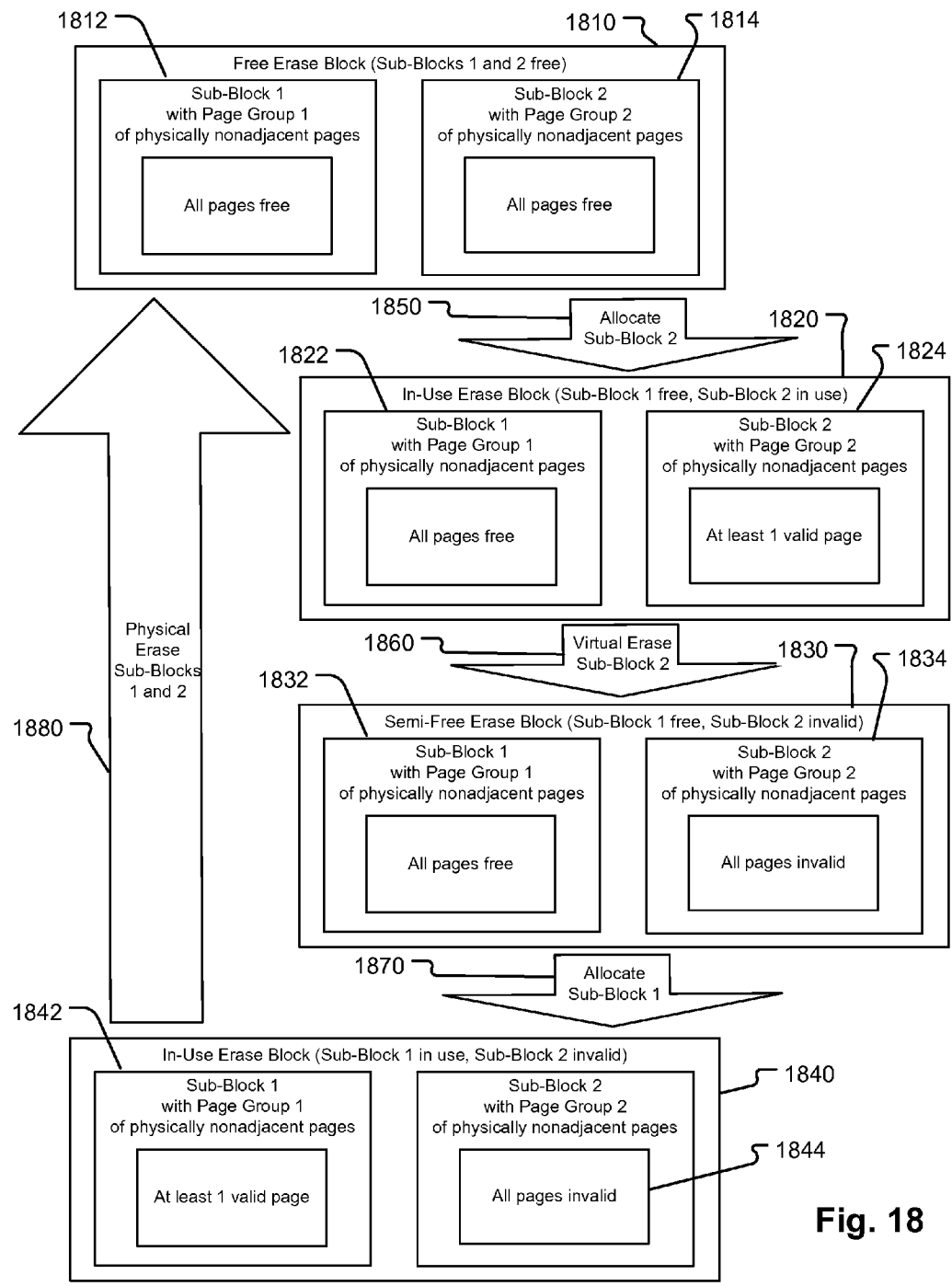
FIG. 18 shows a simplified life cycle of an erase block; unlike FIG. 17, a different order of in-use sub-blocks is followed.

FIG. 18 shows a simplified life cycle of an erase block; unlike FIG. 17, a different order of in-use sub-blocks is followed. Sub-block 2 is first allocated with valid pages, prior to sub-block 1 being allocated with valid pages. After sub-block 2 is allocated with valid pages, sub-block 2 is virtually erased into invalid pages and sub-block 1 is allocated with valid pages.

As an overview of FIG. 18, the life cycle proceeds in the following order: free erase block (sub-blocks 1 and 2 free) 1810; allocate sub-block 2 1850; in-use erase block (sub-block 1 free, sub-block 2 in use) 1820; virtual erase sub-block 2 1860; semi-free erase block (sub-block 1 free, sub-block 2 invalid) 1830; allocate sub-block 1 1870; in-use erase block (sub-block 1 in use, sub-block 2 invalid) 1840; physical erase sub-block 1 and 2 1880; and back to free erase block (sub-blocks 1 and 2 free) 1810.

In the cycle shown in FIGS. 17 and 18, generally both sub-blocks of the same block are not in-use at the same time. However, in FIG. 17 if all sub-block 1s are used, then in response to a request to allocate a new block, a sub-block 2 can be selected and allocated as a new block. Similarly, in FIG. 18 if all sub-block 2s are used, then in response to a request to allocate a new block, a sub-block 1 can be selected and allocated as a new block.

Figure 19:
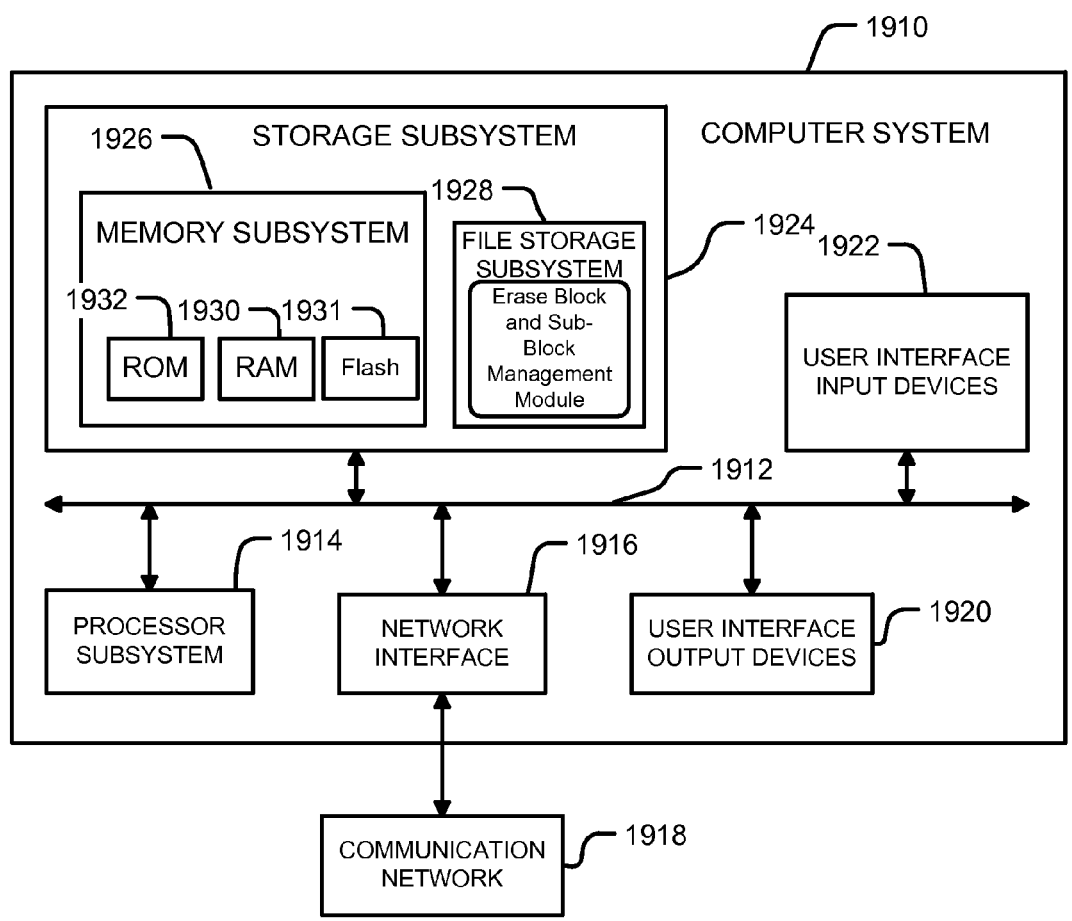
FIG. 19 is a block diagram of an example computer system.

FIG. 19 is a block diagram of a computer system 1910 that can include an erase block and sub-block management module illustrated in FIG. 1.

Computer system 1910 typically includes a processor subsystem 1914 which communicates with a number of peripheral devices via bus subsystem 1912. These peripheral devices may include a storage subsystem 1924, comprising a memory subsystem 1926 and a file storage subsystem 1928, user interface input devices 1922, user interface output devices 1920, and a network interface subsystem 1916. The input and output devices allow user interaction with computer system 1910. Network interface subsystem 1916 provides an interface to outside networks, including an interface to communication network 1918, and is coupled via communication network 1918 to corresponding interface devices in other computer systems. Communication network 1918 may comprise many interconnected computer systems and communication links. These communication links may be wireline links, optical links, wireless links, or any other mechanisms for communication of information, but typically it is an IP-based communication network. While in one embodiment, communication network 1918 is the Internet, in other embodiments, communication network 1918 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1922 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1910 or onto computer network 1918.

User interface output devices 1920 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 1910 to the user or to another machine or computer system.

Storage subsystem 1924 stores the basic programming and data constructs that provide the functionality of certain embodiments of the present invention. For example, the various modules implementing the functionality of certain embodiments of the invention may be stored in storage subsystem 1924. For example, the erase block and sub-block management module implementing the technology described above can be stored in storage subsystem 1924. These software modules are generally executed by processor subsystem 1914.

Memory subsystem 1926 typically includes a number of memories including a main random access memory (RAM) 1930 for storage of instructions and data during program execution and a read only memory (ROM) 1932 in which fixed instructions are stored. Memory subsystem 1926 can also include a flash memory 1931. File storage subsystem 1928 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1928. The host memory 1926 contains, among other things, computer instructions which, when executed by the processor subsystem 1914, cause the computer system to operate or perform functions as described herein. As used herein, processes and software that are said to run in or on "the host" or "the computer", execute on the processor subsystem 1914 in response to computer instructions and data in the host memory subsystem 1926 including any other local or remote storage for such instructions and data.

Bus subsystem 1912 provides a mechanism for letting the various components and subsystems of computer system 1910 communicate with each other as intended. Although bus subsystem 1912 is shown schematically as a single bus, alternative embodiments of the bus subsystem may use multiple busses.

Computer system 1910 itself can be of varying types including a personal computer, a portable computer, a workstation, a computer terminal, a network computer, a television, a mainframe, a server farm, or any other data processing system or user device. Due to the ever changing nature of computers and networks, the description of computer system 1910 depicted in FIG. 19 is intended only as a specific example for purposes of illustrating the preferred embodiments of the present invention. Many other configurations of computer system 1910 are possible having more or less components than the computer system depicted in FIG. 19.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating a NAND array including a plurality of pages, wherein the plurality of pages of the NAND array are divided into a plurality of page groups, comprising:
   allowing access to memory cells within a first page group of a plurality of page groups in an erase block of the NAND array, while minimizing access to memory cells within a second page group of the plurality of page groups in the erase block of the NAND array,
   wherein pages in the page group are physically nonadjacent with each other in the NAND array.

2. The method of claim 1,
   wherein said allowing access includes, allowing program operations on memory cells within the first page group of the plurality of page groups in the erase block of the NAND array, and
   wherein said minimizing access includes, minimizing program operations on memory cells within the second page group of the plurality of page groups in the erase block of the NAND array.

3. The method of claim 1,
   wherein said allowing access includes, allowing read operations on memory cells within the first page group of the plurality of page groups in the erase block of the NAND array, and
   wherein said minimizing access includes, minimizing read operations on memory cells within the second page group of the plurality of page groups in the erase block of the dimensional NAND array.

4. The method of claim 1,
   wherein an erase instruction for a page group, results in the page group having an invalid status indicating (i) delayed erase of the page group and (ii) unavailability of the pages of the page group for read and write memory operations until at least the delayed erase of the page.

5. The method of claim 4,
   wherein, when both the first and second page groups have received the erase instruction, the erase block which contains these two page groups are erased, and the invalid status for all of the plurality of page groups is removed.

6. The method of claim 1,
   wherein the first page group and the second page group have checkerboard patterns offset with respect to each other.

7. The method of claim 1,
   wherein pages in the plurality of pages include series of physically adjacent memory cells in the NAND array.

8. The method of claim 7,
   wherein series of physically adjacent memory cells are arranged such that, a page in the plurality of pages includes memory cells in a same memory cell layer of the NAND array, accessed by a same word line, and accessed by different bit lines,
   wherein any two pages of the first one of the plurality of page groups are mutually physically nonadjacent, due to at least one of:
   (i) at least one intervening word line in between the two pages,
   (ii) at least one intervening memory cell layer in between the two pages, and
   (iii) the two pages positioned in different memory cell layers and accessed by different word lines.

9. The method of claim 7,
   wherein series of physically adjacent memory cells are arranged such that, a page in the plurality of pages includes memory cells in different layers of the NAND array, accessed by a same word line,
   wherein any two pages of the first one of the plurality of page groups are mutually physically nonadjacent, due to at least one of:
   (i) at least one intervening word line in between the two pages,
   (ii) at least one intervening memory string stack in between the two pages, and
   (iii) the two pages sharing no memory strings and accessed by different word lines.

10. The method of claim 7,
    wherein series of physically adjacent memory cells are arranged such that, a page in the plurality of pages includes memory cells in a same layer of the NAND array, accessed by different word lines,
    wherein any two pages of the first one of the plurality of page groups are mutually physically nonadjacent, due to at least one of:
    (i) at least one intervening memory cell layer in between the two pages, (ii) at least one intervening memory string stack in between the two pages, and
(iii) the two pages positioned in different memory cell layers and positioned in different memory string stacks.

11. A computer-readable non-transitory storage medium embodying instructions for a NAND array including a plurality of pages, wherein the NAND array is divided into a plurality of page groups, the instructions when executed perform:
allowing access to memory cells within a first page group of a plurality of page groups in an erase block of the NAND array, while minimizing access to memory cells within a second page group of the plurality of page groups in the erase block of the NAND array, wherein pages in the page group are physically nonadjacent with each other in the NAND array.

12. The computer-readable non-transitory storage medium of claim 11,
wherein said allowing access includes, allowing program operations on memory cells within the first page group of the plurality of page groups in the erase block of the three dimensional NAND array, and
wherein said minimizing access includes, disallowing program operations on memory cells within the second page group of the plurality of page groups in the erase block of the three dimensional NAND array.

13. The computer-readable non-transitory storage medium of claim 11,
wherein said allowing access includes, allowing read operations on memory cells within the first page group of the plurality of page groups in the erase block of the three dimensional NAND array, and
wherein said minimizing access includes, disallowing read operations on memory cells within the second page group of the plurality of page groups in the erase block of the three dimensional NAND array.

14. The computer-readable non-transitory storage medium of claim 11,
wherein an erase instruction for a page group, results in the page group having an invalid status indicating (i) delayed erase of the page group and (ii) unavailability of the pages of page group for read and write memory operations until at least the delayed erase of the page.

15. The computer-readable non-transitory storage medium of claim 14,
wherein, when both the first and second page groups have received the erase instruction, the erase block which contains these two page groups are physically erased, and the invalid status for all of the plurality of page groups is removed.

16. The computer-readable non-transitory storage medium of claim 11,
wherein the first page group and the second page group have checkerboard patterns offset with respect to each other.

17. The computer-readable non-transitory storage medium of claim 11,
wherein pages in the plurality of pages include series of physically adjacent memory cells in the NAND array.

18. The computer-readable non-transitory storage medium of claim 17,
wherein series of physically adjacent memory cells are arranged such that, a page in the plurality of pages includes memory cells in a same memory cell layer of the NAND array, accessed by a same word line, and accessed by different bit lines,
wherein any two pages of the first one of the plurality of page groups are mutually physically nonadjacent, due to at least one of:
(i) at least one intervening word line in between the two pages,
(ii) at least one intervening memory cell layer in between the two pages, and
(iii) the two pages positioned in different memory cell layers and accessed by different word lines.

19. The computer-readable non-transitory storage medium of claim 17,
wherein series of physically adjacent memory cells are arranged such that, a page in the plurality of pages includes memory cells in different layers of the NAND array, accessed by a same word line,
wherein any two pages of the first one of the plurality of page groups are mutually physically nonadjacent, due to at least one of:
(i) at least one intervening word line in between the two pages,
(ii) at least one intervening memory string stack in between the two pages, and
(iii) the two pages sharing no memory strings and accessed by different word lines.

20. The computer-readable non-transitory storage medium of claim 17,
wherein series of physically adjacent memory cells are arranged such that, a page in the plurality of pages includes memory cells in a same layer of the NAND array, accessed by different word lines,
wherein any two pages of the first one of the plurality of page groups are mutually physically nonadjacent, due to at least one of:
(i) at least one intervening memory cell layer in between the two pages,
(ii) at least one intervening memory string stack in between the two pages, and
(iii) the two pages positioned in different memory cell layers and positioned in different memory string stacks.

21. A computing device, comprising:
a processor;
a NAND array including a plurality of pages, wherein the plurality of pages of the NAND array are divided into a plurality of page groups; and
control circuitry coupled to at least one of the processor and the NAND array, the control circuitry allowing access to memory cells within a first page group of a plurality of page groups in an erase block of the NAND array, while minimizing access to memory cells within a second page group of the plurality of page groups in the erase block of the NAND array,
wherein virtual erase blocks in a plurality of virtual erase blocks are mapped to one of the plurality of page groups, page groups in the plurality of page groups including pages from the plurality of pages that are mutually physically nonadjacent with each other in the NAND array, and
wherein pages in the page group are physically nonadjacent with each other in the NAND array.

* * * * *